United States Patent
Asano et al.

(10) Patent No.: US 7,400,197 B2
(45) Date of Patent: Jul. 15, 2008

(54) GAIN CONTROL CIRCUIT CAPABLE OF REDUCING CHANGE IN GAIN DUE TO VARIATION OF AMBIENT TEMPERATURE

(75) Inventors: Shoichi Asano, Fukushima-ken (JP); Kazuharu Aoki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 141 days.

(21) Appl. No.: 11/387,938

(22) Filed: Mar. 22, 2006

(65) Prior Publication Data
US 2006/0255858 A1 Nov. 16, 2006

(30) Foreign Application Priority Data
May 10, 2005 (JP) ............... 2005-137479

(51) Int. Cl.
*H03G 3/30* (2006.01)
(52) U.S. Cl. .................. 330/289; 330/285
(58) Field of Classification Search .......... 330/285, 330/289
See application file for complete search history.

(56) References Cited

U.S. PATENT DOCUMENTS
7,109,897 B1 * 9/2006 Levesque .................. 341/67

FOREIGN PATENT DOCUMENTS
JP 7-40652 5/1995

* cited by examiner

*Primary Examiner*—Steven J Mottola
(74) *Attorney, Agent, or Firm*—Beyer Law Group LLP

(57) ABSTRACT

A gain control circuit capable of keeping a constant gain without being affected by ambient temperature includes a variable resistor element connected to a power supply terminal, a control unit for controlling the resistance value of the variable resistor element on the basis of a gain control voltage, an amplifying transistor that is supplied with a power supply voltage through the variable resistor element, a current detecting resistor that is interposed between the variable resistor element and a collector of the amplifying transistor, and a voltage detecting unit that detects a drop dropped by the current detecting resistor. The dropped voltage detected by the voltage detecting unit is fed back to the control unit to control the resistance value of the variable resistor element such that a current flowing through the current detecting resistor does not vary.

3 Claims, 2 Drawing Sheets

GAIN CONTROL CIRCUIT CAPABLE OF REDUCING CHANGE IN GAIN DUE TO VARIATION OF AMBIENT TEMPERATURE

BACKGROUND OF THE INVENTION

1. Field of the Invention

The present invention relates to a gain control circuit suitable for, for example, a power amplifier of a mobile phone.

2. Description of the Related Art

A conventional gain control circuit shown in FIG. 3 has a differential circuit, which is an amplifying circuit having an emitter connected to the ground, incorporated thereinto. The amplifying circuit having the emitter connected to the ground includes a transistor 1, a variable resistor element 5, which is a PIN diode, and a resistor 7. Of a current flowing through an emitter of the transistor, a DC bias current is differentially branched to transistors 2 and 3. The emitter current depends on a transistor 4. An input signal is amplified by the transistor 1. Since the branch of signals at the emitter of the transistor 1 is prevented by a transistor 6, the gain is determined by the ratio of the resistor 7 on the collector side to the AC resistance of the variable resistor element 5.

The AC resistance of the variable resistor element 5 is changed in inverse proportion to a DC bias current flowing through the variable resistor element 5. Therefore, it is possible to change the gain of the transistor 1 with the DC bias current flowing through the variable resistor element 5.

The DC bias current flowing through the variable resistor element 5 is determined by a different between a control voltage applied to the base of the transistor 2 and the voltage of the base of the transistor 3 set by resistors 10 and 11. Even when the DC bias current flowing through the variable resistor element 5 is varied by the control voltage, the DC bias current flowing through the transistor 1, which is the sum of currents flowing through the transistors 2 and 3, is kept constant by resistors 12, 13, and 14 connected to the transistor 4.

According to the convention structure, it is possible to change the gain by varying the control voltage.

However, in this case, although the control voltage is constant, a variation in ambient temperature causes the DC bias current flowing through the variable resistor element 5 to be changed, resulting in a variation in the gain of the transistor 1.

SUMMARY OF THE INVENTION

The present invention is made in view of the above-mentioned problem, and it is an object of the present invention to provide a gain control circuit capable of keeping a uniform gain without being affected by ambient temperature.

According to a first aspect of the invention, there is provided a gain control circuit that reduces a change in gain due to a variation in ambient temperature. The gain control circuit includes a variable resistor element that is connected to a power supply terminal; a control unit that controls the resistance value of the variable resistor element on the basis of a gain control voltage; an amplifying transistor that is supplied with a power supply voltage through the variable resistor element; a current detecting resistor that is interposed between the variable resistor element and a collector of the amplifying transistor; and a voltage detecting unit that detects a voltage dropped by the current detecting resistor. In the gain control circuit, the dropped voltage detected by the voltage detecting unit is fed back to the control unit to control the resistance value of the variable resistor element such that a current flowing through the current detecting resistor does not vary.

In the gain control circuit according to this aspect, preferably, the variable resistor element is composed of a first P-channel field effect transistor, and the control unit is composed of a first operational amplifier. In addition, preferably, the voltage detecting unit is composed of a second operational amplifier, and the control voltage and an output voltage proportional to the dropped voltage detected by the second operational amplifier are input to the first operational amplifier. Further, preferably, an output voltage of the second operational amplifier is input to a gate of the first P-channel field effect transistor.

In the above-mentioned structure, preferably, the gain control circuit further includes a second P-channel field effect transistor that is connected to the power supply terminal and supplies the power supply voltage to the collector of the amplifying transistor. In addition, preferably, the collector of the amplifying transistor is connected to the second P-channel field effect transistor, and the output voltage of the first operational amplifier is input to a gate of the second P-channel field effect transistor.

In the gain control circuit according to this aspect, preferably, the width of the gate of the second P-channel field effect transistor is set to be considerably larger than that of the gate of the first P-channel field effect transistor.

In the gain control circuit according to this aspect, it is preferable that the width of the gate of the second P-channel field effect transistor be set to be one hundred or more times larger than that of the gate of the first P-channel field effect transistor.

DESCRIPTION OF THE PREFERRED EMBODIMENT

Figure 1:
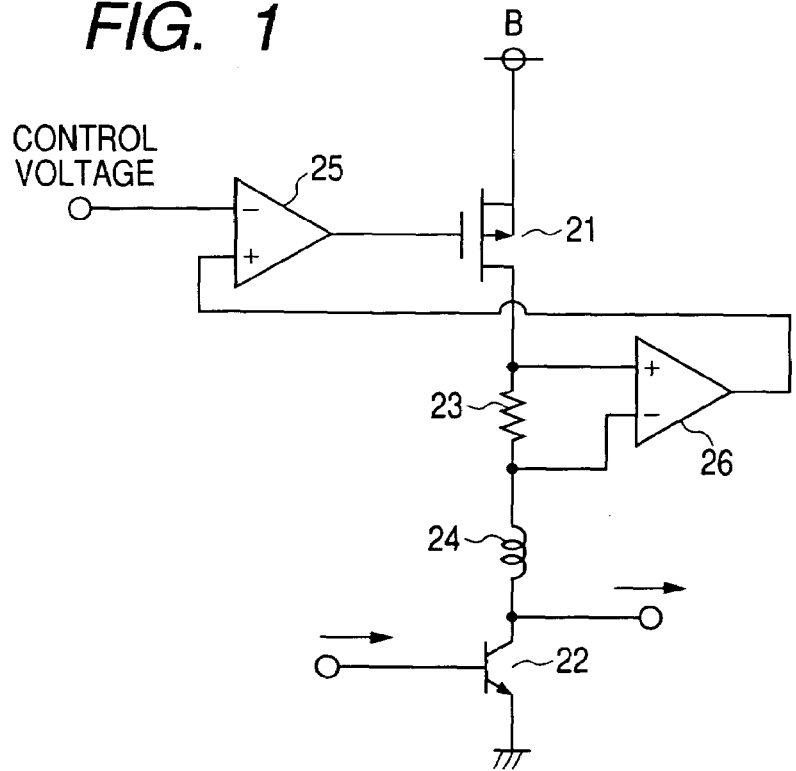
FIG. 1 is a circuit diagram illustrating the structure of a gain control circuit according to a first embodiment of the invention.

A first embodiment of the invention is shown in FIG. 1. As shown in FIG. 1, a power supply voltage is supplied to an amplifying transistor 22 through a first variable resistor element 21 connected to a power supply terminal B. A current detecting resistor 23 having a small resistance value is interposed between the first variable resistor element 21 and the amplifying transistor 22, and a load 24 is interposed between the current detecting resistor 23 and a collector of the amplifying transistor 22. The first variable resistor element 21 is composed of a three-terminal semiconductor part having a current input terminal, a current output terminal, and a control terminal. A current flowing through the semiconductor part is controlled by a difference in voltage between the current input terminal and the control terminal. For example, a first P-channel field effect transistor composed of, for example, a CMOS is used as the first variable resistor element 21. In the three-terminal semiconductor part, a source, serving as the current input terminal, is connected to the power supply terminal B, and a drain, serving as the current output terminal, is connected to the current detecting resistor 23. A gate serves as the control terminal. An emitter of the amplifying transistor 22 is connected to the ground, and a base thereof is supplied with a high-frequency signal. The amplified high-frequency signal is output from a collector.

The resistance value of the first variable resistor element 21 is controlled by a control unit 25. The control unit 25 is composed of a first operational amplifier. A control voltage is input to one input terminal (an inverting input terminal) of the first operational amplifier. An output voltage of the control unit 25 is input to the gate, serving as the control terminal, of the first variable resistor element 21.

A voltage drop generated in the current detecting resistor 23 is detected by a voltage detecting unit 26. The voltage detecting unit 26 is composed of a second operational amplifier. An output voltage of the second operational amplifier is input to the other input terminal (a non-inverting input terminal) of the control unit 25.

Further, the output voltage of the voltage detecting unit 26 is fed back to the control unit. Therefore, when the control voltage is kept constant, the voltage of the collector of the amplifying transistor 22 is controlled to be a predetermined value. When the control voltage varies, the resistance value of the first variable resistor element 21 is changed, which causes the voltage of the collector of the amplifying transistor 22 to be changed, resulting in a variation in the gain of the amplifying transistor 22.

Next, a description will be made below of the operation of the first embodiment when ambient temperature varies under the conditions where the control voltage is kept constant. In general, a current flowing through a semiconductor part having a PN junction increases as the ambient temperature rises. For example, a current flowing through the collector of the amplifying transistor 22 increases as the ambient temperature rises. As the current flowing through the collector becomes larger, a voltage between both ends of the current detecting resistor 23 becomes larger, which resulting in a rise in the output voltage of the voltage detecting unit 26. Since the output voltage is input to the control unit 25, the output voltage of the control unit 25 also rises. The output voltage is input to the control terminal of the first variable resistor element 21, which causes a difference in voltage between the source and the gate to be reduced, resulting in a reduction in current. That is, the resistance value increases. As a result, control is performed to reduce the current flowing through the collector of the amplifying transistor 22, and thus a change in current due to a temperature variation is reduced.

Figure 2:
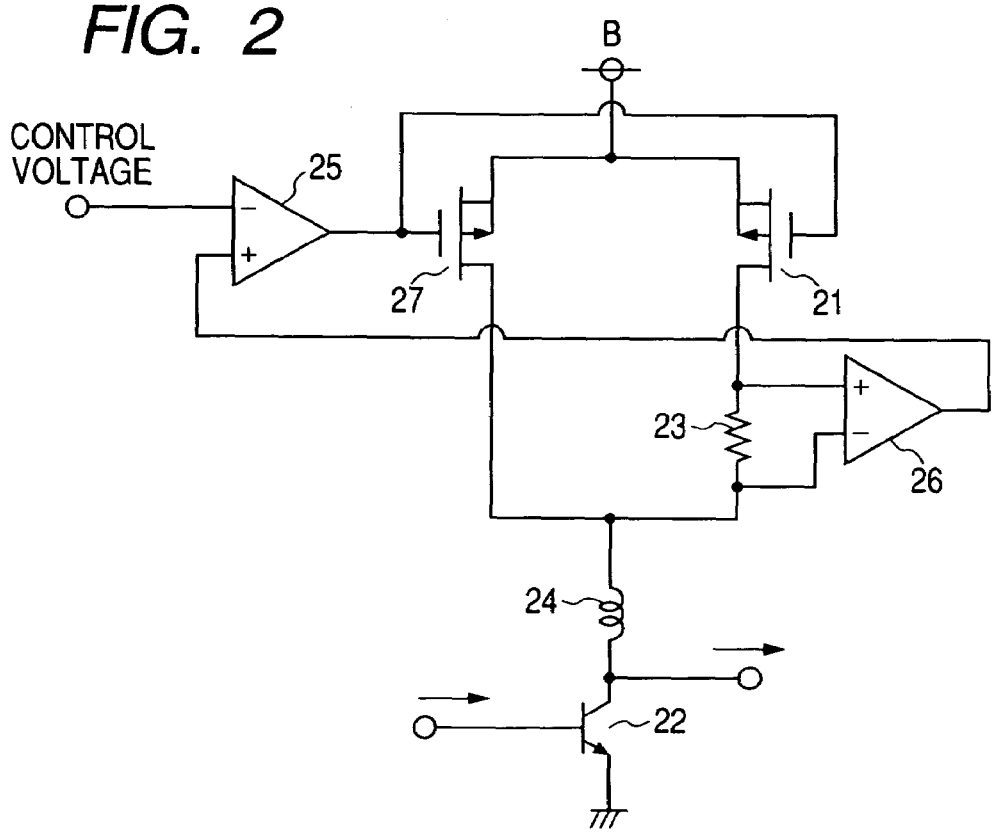
FIG. 2 is a circuit diagram illustrating the structure of a gain control circuit according to a second embodiment of the invention.
Figure 3:
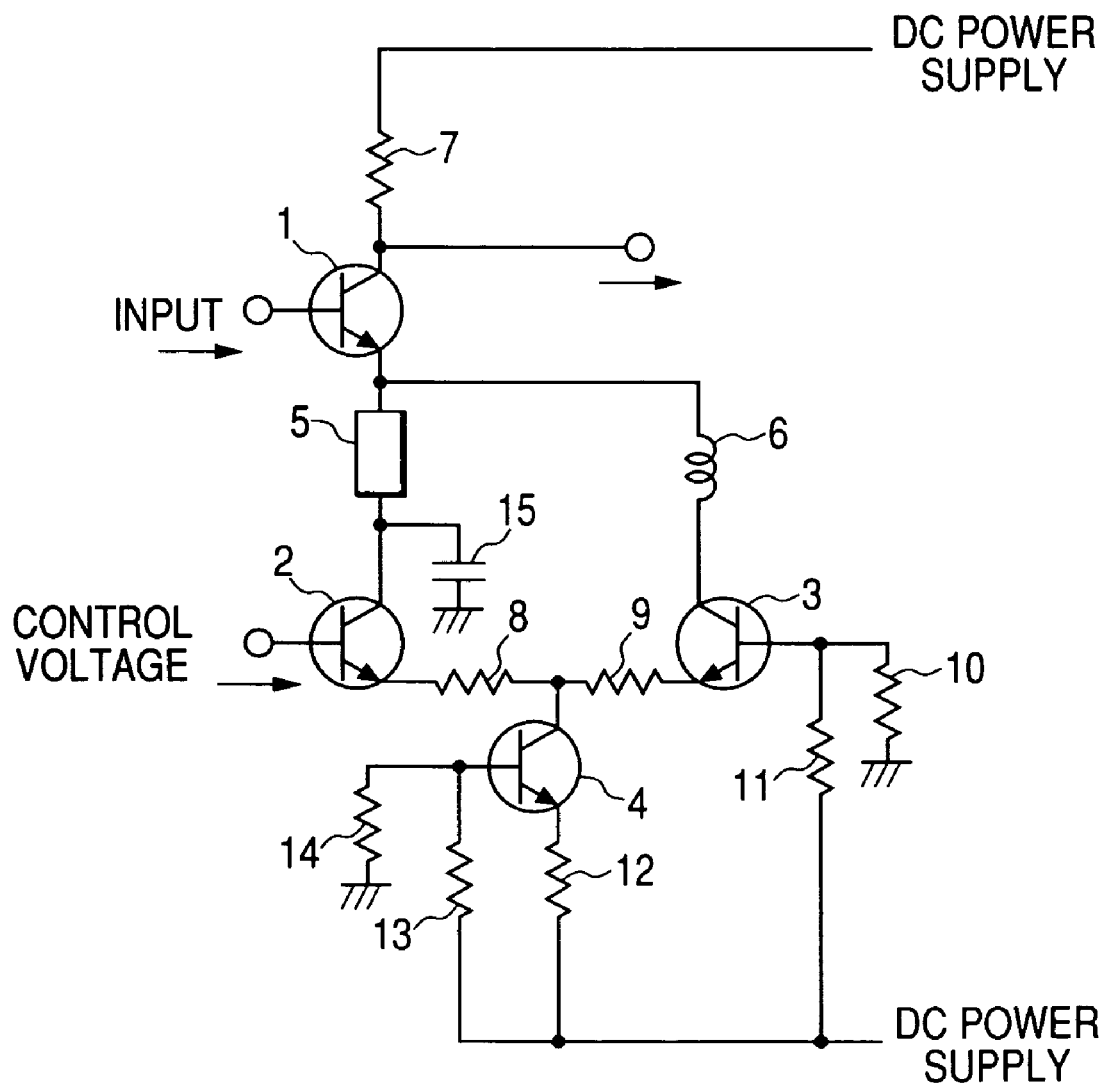
FIG. 3 is a circuit diagram illustrating the structure of a conventional gain control circuit.

FIG. 2 shows a second embodiment of the invention. In the second embodiment, a second variable resistor element 27 is additionally provided. The second variable resistor element 27 is composed of a second P-channel field effect transistor. A current input terminal of the second variable resistor element 27 is connected to the power supply terminal B, and a current output terminal thereof is connected to the collector of the amplifying transistor 22. That is, except for the load of the amplifying transistor 22, no part generating a voltage drop caused by the flow of current is interposed between the current output terminal and the collector of the amplifying transistor 22. The output voltage of the control unit 25 is also input to the control terminal of the second variable resistor element 27.

In the second embodiment, similar to the first embodiment shown in FIG. 1, a change in current due to a temperature variation is reduced. Further, since a current is directly supplied from the second variable resistor element 27 to the amplifying transistor 22, it is possible to raise a collector voltage. Therefore, this embodiment is preferable for a portable apparatus driven by a battery.

When the first P-channel field effect transistor and the second P-channel field effect transistor are used as the first variable resistor element 21 and the second variable resistor element 27, the width of the gate of the second P-channel field effect transistor is set to be one hundred or more times larger than that of the gate of the first P-channel field effect transistor. Therefore, most of the current flowing through the second P-channel field effect element flows toward the collector of the amplifying transistor 22, which makes it possible to further raise the collector voltage. It is preferable that the minimum amount of current required for detecting a change in current due to a temperature variation flow through the first P-channel field effect transistor.

As described above, according to the invention, there is provided a gain control circuit that reduces a change in gain due to a variation in ambient temperature. The gain control circuit includes a variable resistor element that is connected to a power supply terminal; a control unit that controls the resistance value of the variable resistor element on the basis of a gain control voltage; an amplifying transistor that is supplied with a power supply voltage through the variable resistor element; a current detecting resistor that is interposed between the variable resistor element and a collector of the amplifying transistor; and a voltage detecting unit that detects a voltage dropped by the current detecting resistor. In the gain control circuit, the dropped voltage detected by the voltage detecting unit is fed back to the control unit to control the resistance value of the variable resistor element such that a current flowing through the current detecting resistor does not vary. According to this structure, even when a current flowing through the amplifying transistor varies due to a change in ambient temperature, it is possible to prevent a variation in gain.

Further, according to the embodiments of the invention, the variable resistor element is composed of a first P-channel field effect transistor, and the control unit is composed of a first operational amplifier. In addition, preferably, the voltage detecting unit is composed of a second operational amplifier, and the control voltage and an output voltage proportional to the dropped voltage detected by the second operational amplifier are input to the first operational amplifier. Further, preferably, an output voltage of the second operational amplifier is input to a gate of the first P-channel field effect transistor. Therefore, it is possible to prevent a variation in current flowing through the amplifying transistor with a simple structure using general-purpose parts.

Furthermore, according to the embodiments of the invention, the gain control circuit further includes a second P-channel field effect transistor that is connected to the power supply terminal and supplies the power supply voltage to the collector of the amplifying transistor. In addition, preferably, the collector of the amplifying transistor is connected to the second P-channel field effect transistor, and the output voltage of the first operational amplifier is input to a gate of the second P-channel field effect transistor. Therefore, it is possible to raise the collector voltage of the amplifying transistor.

Moreover, according to the embodiments of the invention, the width of the gate of the second P-channel field effect transistor is set to be considerably larger than that of the gate of the first P-channel field effect transistor. Therefore, it is possible to further raise the collector voltage of the amplifying transistor, and thus the invention is preferable for a portable apparatus.

Further, according to the embodiments of the invention, the width of the gate of the second P-channel field effect transistor is set to be one hundred or more times larger than that of the gate of the first P-channel field effect transistor. Therefore, most of the current flowing through the second P-channel field effect transistor flows through the collector of the amplifying transistor, which makes it possible to raise the collector voltage of the amplifying transistor to the maximum.

The invention claimed is:

1. A gain control circuit that reduces a change in gain due to a variation in ambient temperature, comprising:
   a variable resistor element that is connected to a power supply terminal, the variable resistor element including a first P-channel field effect transistor and a second P-channel field effect transistor;
   a control unit that controls the resistance value of the first and second variable resistor elements on the basis of a gain control voltage, the control unit including a first operational amplifier;
   an amplifying transistor that is supplied with a power supply voltage through the variable resistor element;
   a current detecting resistor that is interposed between the first P-channel field effect transistor of the variable resistor element and a collector of the amplifying transistor, the collector of the amplifying transistor being connected to the second P-channel field effect transistor; and
   a voltage detecting unit that detects a voltage dropped by the current detecting resistor, the voltage detecting unit including a second operational amplifier,
   wherein the dropped voltage detected by the voltage detecting unit is fed back to the control unit to control the resistance value of the variable resistor element such that a current flowing through the current detecting resistor does not vary,
   wherein the control voltage and an output voltage proportional to the dropped voltage detected by the second operational amplifier are input to the first operational amplifier, and
   an output voltage of the first operational amplifier is input to a gate of the first P-channel field effect transistor and to a gate of the second P-channel field effect transistor.

2. The gain control circuit according to claim 1,
   wherein the width of the gate of the second P-channel field effect transistor is set to be considerably larger than that of the gate of the first P-channel field effect transistor.

3. The gain control circuit according to claim 2,
   wherein the width of the gate of the second P-channel field effect transistor is set to be one hundred or more times larger than that of the gate of the first P-channel field effect transistor.

* * * * *